US010257963B2

(12) United States Patent
Ozyalcin et al.

(10) Patent No.: US 10,257,963 B2
(45) Date of Patent: Apr. 9, 2019

(54) METHODS AND SYSTEM FOR OIL IMMERSION COOLING

(71) Applicant: CGG SERVICES SAS, Massy (FR)

(72) Inventors: Cemil Ozyalcin, Herndon, VA (US); Edward Joseph Barragy, Richmond, TX (US); Laurent Clerc, Houston, TX (US)

(73) Assignee: CGG SERVICES SAS, Massy (FR)

( * ) Notice: Subject to any disclaimer, the term of this patent is extended or adjusted under 35 U.S.C. 154(b) by 0 days.

(21) Appl. No.: 15/490,040

(22) Filed: Apr. 18, 2017

(65) Prior Publication Data

US 2017/0311484 A1 Oct. 26, 2017

Related U.S. Application Data

(60) Provisional application No. 62/324,897, filed on Apr. 20, 2016.

(51) Int. Cl.
*H05K 7/20* (2006.01)
*H01L 23/473* (2006.01)
*H01L 23/427* (2006.01)

(52) U.S. Cl.
CPC ....... *H05K 7/20645* (2013.01); *H01L 23/427* (2013.01); *H01L 23/473* (2013.01);
(Continued)

(58) Field of Classification Search
CPC ..... H01L 23/473; H01L 23/427; H01L 23/44; H01L 23/4735; G06F 1/20;
(Continued)

(56) References Cited

U.S. PATENT DOCUMENTS 7,724,524 B1 5/2010 Campbell et al.
7,905,106 B2 3/2011 Attlesey
(Continued)

FOREIGN PATENT DOCUMENTS

DE 20 2005 002 390 U1 7/2005
EP 2802197 5/2015

OTHER PUBLICATIONS

Extended European Search Report in corresponding European Application No. EP 17 30 5426 dated Dec. 1, 2017. (All references not herewith have been previously made of record).
(Continued)

*Primary Examiner* — Adam B Dravininkas
(74) *Attorney, Agent, or Firm* — Patent Portfolio Builders PLLC

(57) ABSTRACT

A system for immersion cooling computing system equipment includes a container containing a volume of immersion cooling fluid. At least one heat generating computing system equipment component and a liquid-liquid heat exchanger are disposed in the volume of immersion cooling fluid. A manifold system is disposed between the heat generating computing system equipment component and the liquid-liquid heat exchanger to direct a flow of immersion cooling fluid between the heat generating computing system component and the liquid-liquid heat exchanger and to isolate the flow of immersion cooling fluid from a bulk amount of immersion cooling fluid. The flow of immersion cooling fluid and the bulk amount of immersion cooling fluid constitutes the volume of immersion cooling fluid.

17 Claims, 11 Drawing Sheets

(52) U.S. Cl.
CPC ..... *H05K 7/20236* (2013.01); *H05K 7/20272* (2013.01); *H05K 7/20772* (2013.01)

(58) Field of Classification Search
CPC .... G06F 2200/201; G06F 1/206; G06F 1/181; H05K 7/20236; H05K 7/20772; H05K 7/20781; H05K 7/203; H05K 7/20218; H05K 7/20327; H05K 5/067; H05K 7/20763

See application file for complete search history.

(56) References Cited

U.S. PATENT DOCUMENTS

| | | | | |
|---|---|---|---|---|
| 9,596,787 B1* | 3/2017 | Iyengar | ............... | H05K 7/203 |
| 2009/0242174 A1* | 10/2009 | McCutchen | ........ | F28D 15/0233 |
| | | | | 165/104.25 |
| 2011/0132579 A1 | 6/2011 | Best et al. | | |
| 2011/0315353 A1* | 12/2011 | Campbell | .......... | H05K 7/20809 |
| | | | | 165/104.31 |
| 2013/0019614 A1* | 1/2013 | Campbell | .......... | H05K 7/20136 |
| | | | | 62/62 |
| 2014/0211412 A1 | 7/2014 | Best | | |
| 2014/0301037 A1* | 10/2014 | Best | .................. | H05K 7/20781 |
| | | | | 361/679.53 |
| 2014/0307384 A1 | 10/2014 | Best | | |
| 2015/0146368 A1* | 5/2015 | Shafer | ................ | H05K 7/20236 |
| | | | | 361/679.53 |
| 2015/0181762 A1 | 6/2015 | Boyd et al. | | |
| 2015/0237767 A1* | 8/2015 | Shedd | ................ | H05K 7/20254 |
| | | | | 165/104.31 |
| 2015/0359132 A1* | 12/2015 | Campbell | .......... | H05K 7/20236 |
| | | | | 361/700 |
| 2016/0014932 A1 | 1/2016 | Best et al. | | |
| 2016/0113150 A1* | 4/2016 | Krug, Jr. | ............. | H05K 7/20781 |
| | | | | 165/104.31 |

OTHER PUBLICATIONS

Partial European Search Report in corresponding European Application No. 17 305 426.3 dated Aug. 28, 2017. (US2014/307384 was made of record in an information Disclosure Statement dated Apr. 4, 2018).

\* cited by examiner

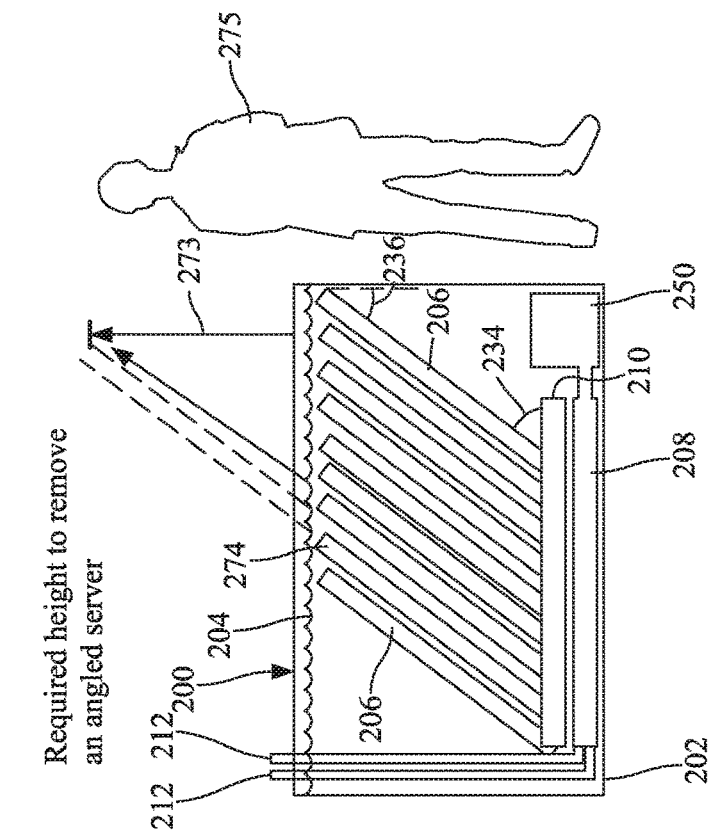
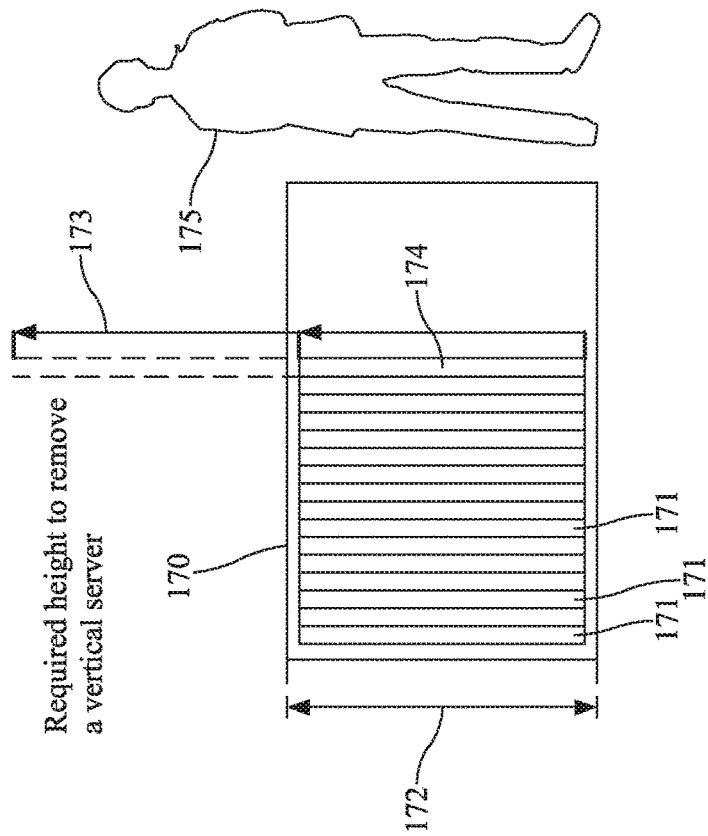

METHODS AND SYSTEM FOR OIL IMMERSION COOLING

CROSS REFERENCE TO RELATED APPLICATIONS

This application claims priority and benefit from U.S. Provisional Patent Application No. 62/324,897, filed Apr. 20, 2016, for "Methods and System for Oil Immersion Cooling Number 1", the entire contents of which is incorporated herein by reference.

TECHNICAL FIELD

Embodiments of the subject matter disclosed herein generally relate to methods and systems for oil immersion cooling of computing systems.

BACKGROUND

Seismic data acquisition surveys include both land and seabed surveys that utilize seismic receivers arranged in a pattern or grid on either the land or seabed. The seismic receivers or seismic nodes are attached at various points along the length of a cable, and the seismic data acquisition grid is defined by placing multiple cables in spaced parallel lines. The seismic sources or seismic shots are then created by towing or driving one or more seismic signal generators such as a seismic gun along tow lines or paths, e.g., shot lines, that are perpendicular to the arrangement of the parallel cables. The seismic signal generators are then actuated at multiple locations along the tow lines or paths and the resulting seismic signals are recorded at the seismic receivers on the cables. The recorded seismic signals are then processed and analyzed to yield a three dimensional (3D) image of the subsurface below the seismic data acquisition grid.

Computing systems are utilized to control all aspects of the seismic data acquisition surveys including the collection and processing of seismic data. Due to the large volume of data collection and the complexity involved in processing the data, a significant amount of computing power is required. Computing systems with the required amount of computing power generate significant heat and need to be cooled. As seismic data acquisition surveys typically occur in remote areas or at sea, the computing systems and associated cooling mechanisms need to be both robust and portable. In addition, the need to control or limit power consumption in the field places a further constraint on these computer systems and cooling mechanisms.

The need to cool computing systems such as large server farms and the energy costs associated with the cooling of these computing systems drive the development of innovative and energy efficient cooling systems. These more energy efficient cooling systems favor oil immersion cooling over forced air systems or cooling fluid circulated heat sinks or cooling jackets. In an oil immersion cooling system, the computing components to be cooled are at least partially immersed in dielectric oil. The dielectric oil, being in contact with the computing components, conducts heat away from the computing components. To remove the transferred heat from the dielectric oil, the dielectric oil is circulated, for example, using a pump, through a heat exchanger, through which a separate cooling liquid is also circulated. This heat exchanger can be located external to the container holding the dielectric oil and the computing components or internal to the container.

An example of a liquid immersion cooling solution for data center servers is the CarnoJet System, which is commercially available from Green Revolution Cooling of Austin, Tex. The CarnoJet System utilizes a 'pump module' containing a primary pump, a secondary pump, an oil/water heat exchanger, and a control mechanism. Associated with each pump module is one or more custom built steel tanks filled with heat generating information technology (IT) equipment immersed in the dielectric coolant termed GreenDef, which is broadly similar to mineral oil. The IT equipment in the tank is supported on a built in 'rack' rail system. The pump module and tanks are connected via hoses. The pump circulates oil through the heat exchanger and back to the tanks. Cooling water is supplied to the heat exchanger via and external source. While this system cools high thermal density IT equipment very effectively, it has several shortcomings particularly regarding cost, size and complexity.

Therefore, effective liquid immersion cooling system are desired that provide for effective cooling of the components of a computing system in a cost-effective and simple arrangement that in particular is portable and suitable for use in field application such as those required by seismic data acquisition surveys.

SUMMARY

Embodiments are directed to systems and methods for immersion cooling of computing system for cost effective rapid deployments in modular seismic processing sites. The system uses a submersible pump in fluid communication with a manifold system that holds and supports the heat generating computing system components to direct immersion cooling fluid to and through each individual computing system component. In one embodiment, the manifold system is a three-dimensional (3D) printed manifold system. The manifold system and in particular the 3D printed manifold is customized based on the number and arrangement of the computing system components, the amount of heat generated by each computing system component and the desired flow of immersion cooling fluid through the immersion cooling system and each individual computing system component. The submersible pump is arranged to pull the immersion cooling fluid down through the computing system components or push the immersion cooling fluid up through the computing system components from a location at the bottom of the container or tank containing the immersion cooling fluid and the computing system components.

The immersion cooling fluid removes the heat generated by the computing system components, and at least one liquid-liquid heat exchanger is provided within the container to remove heat from the immersion cooling fluid. In one embodiment, the liquid-liquid heat exchanger is also in communication with a secondary cooling fluid that is routed to the heat exchanger from a source external to the tank. Suitable secondary cooling fluids include water. To provide the desired direction of flow of immersion cooling fluid through the computing system components, i.e., push or pull, and to utilize the liquid-liquid heat exchanger to remove the heat from the immersion cooling fluid and, therefore, the computing system equipment, the liquid-liquid heat exchanger is in fluid communication with the manifold system and the submersible pump. Preferably, the liquid-liquid heat exchanger is located between the manifold system and the submersible pump. In one embodiment, the container includes a self-contained tank with direct secondary coolant lines routed to an internal liquid-liquid heat exchanger to reduce spill hazards and to eliminate the requirement for external pump and cooling modules.

The use of the manifold system isolates the flow of heated or cooled immersion cooling fluid from the bulk immersion cooling fluid in the container where the total volume of the immersion cooling fluid in the container is the flow of immersion cooling fluid through the computing system equipment components and the bulk immersion cooling fluid. Isolating the flow of immersion cooling fluid from the bulk immersion cooling fluid improves the operational efficiency of heat extraction from the computing system equipment. In one embodiment, the manifold system provides sufficient structural support to hold the computing system equipment components independent of conventional computing system equipment holders such as server racks. Alternatively, the manifold system works in conjunction with conventional computing system equipment holders to achieve the desired support for the computing system equipment. In one embodiment, the manifold system holds the computing system equipment components in a vertical orientation. Alternatively, the manifold system holds the computing system equipment components at an orientation or angle other than vertical. This facilitates holding the longer computing system equipment components in a smaller depth of immersion cooling fluid and removing the long computing system equipment components from the container.

In one embodiment, the liquid-liquid heat exchanger, the submersible pump and the manifold system are used to collect hot immersion cooling fluid pulled through the computing system equipment or to push cold immersion cooling fluid through the computing system equipment. The immersion cooling fluid is routed through the manifold system and the heat exchanger that is directly connected to the manifold system or connected to the manifold system through piping or other lines. The heat transfer between the immersion cooling fluid and the secondary cooling fluid, e.g., water or warm water, occurs in the liquid-liquid heat exchanger. In a hot immersion cooling fluid suction method of operation, the cooled immersion cooling fluid then gets pushed up to the top of the container and the surface of the immersion oil by the submersible pump located adjacent the bottom of the container, effectively creating a cool immersion cooling fluid environment in which the computing system equipment can operate. In a cooled immersion cooling fluid push method of operation, the submersible pump pulls the hot immersion cooling fluid from the top of the container and the surface of the bulk immersion cooling fluid and pushes the hot immersion cooling fluid through the liquid-liquid heat exchanger, manifold system and individual computing system components.

Exemplary embodiments facilitate sizing of the container and the manifold system for various computing system equipment immersion cooling scenarios. In addition, the submersible pump, liquid-liquid heat exchanger, such as a shell and tube heat exchanger, and the manifold system are configured in accordance with a wide range of flow rates, pressures and temperatures. The container or tank is then sized in accordance with the number of heat generating computing system equipment components that are used for a particular computing application, e.g., on-site seismic data processing, and the heat load generated by each computing system equipment component. For example, a given seismic processing application requires the use of a minimal number of computing system equipment components configured using the highest density possible. Based on this physical arrangement, the flow rate requirement, the heat load of each computing system equipment component and the approach temperature are calculated. These calculations are used to size the immersion container by selecting the appropriate liquid-liquid heat exchanger and the submersible pump to capture the heat from the computing equipment system.

Exemplary embodiments are directed to a system for immersion cooling computing system equipment. The system includes a container, a volume of immersion cooling fluid disposed in the container, at least one heat generating computing system equipment component disposed in the volume of immersion cooling fluid, a liquid-liquid heat exchanger disposed in the volume of immersion cooling fluid and a manifold system disposed between the at least one heat generating computing system equipment component and the liquid-liquid heat exchanger to direct a flow of immersion cooling fluid between the at least one heat generating computing system component and the liquid-liquid heat exchanger and to isolate the flow of immersion cooling fluid from a bulk amount of immersion cooling fluid. The flow of immersion cooling fluid and the bulk amount of immersion cooling fluid make up the volume of immersion cooling fluid.

Exemplary embodiments are also directed to a system for immersion cooling computing system equipment. The system includes a container, a volume of immersion cooling fluid disposed in the container, at least one heat generating computing system equipment component disposed in the container and the volume of immersion cooling fluid, a liquid-liquid heat exchanger disposed in the volume of immersion cooling fluid and a manifold system disposed between the at least one heat generating computing system equipment component and the liquid-liquid heat exchanger to direct a flow of immersion cooling fluid between the at least one heat generating computing system component and the liquid-liquid heat exchanger and to hold each computing system equipment component at an angle from a vertical orientation within the container.

Exemplary embodiments are also directed to a method for immersion cooling computing system equipment. The method includes filing a container with a volume of immersion cooling fluid, placing a liquid-liquid heat exchanger in the volume of immersion cooling fluid, placing a manifold system in the volume of immersion cooling fluid in communication with the liquid-liquid heat exchanger, placing at least one heat generating computing system equipment component in the volume of immersion cooling fluid in communication with the manifold system such that the manifold system is disposed between the at least one heat generating computing system equipment component and the liquid-liquid heat exchanger and using the manifold system to direct a flow of immersion cooling fluid between the at least one heat generating computing system component and the liquid-liquid heat exchanger and to isolate the flow of immersion cooling fluid from a bulk amount of immersion cooling fluid. The flow of immersion cooling fluid and the bulk amount of immersion cooling fluid make up the volume of immersion cooling fluid.

BRIEF DESCRIPTION OF THE DRAWINGS

The accompanying drawings, which are incorporated in and constitute a part of the specification, illustrate one or more embodiments and, together with the description, explain these embodiments. In the drawings:

FIG. 8 is a schematic illustration of computing system equipment components in a vertical orientation;

FIG. 9 is a schematic illustration of computing system equipment components in an angled orientation;

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. Some of the following embodiments are discussed, for simplicity, with regard to local activity taking place within the area of a seismic survey. However, the embodiments to be discussed next are not limited to this configuration, but may be extended to other arrangements that include regional activity, conventional seismic surveys, etc.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
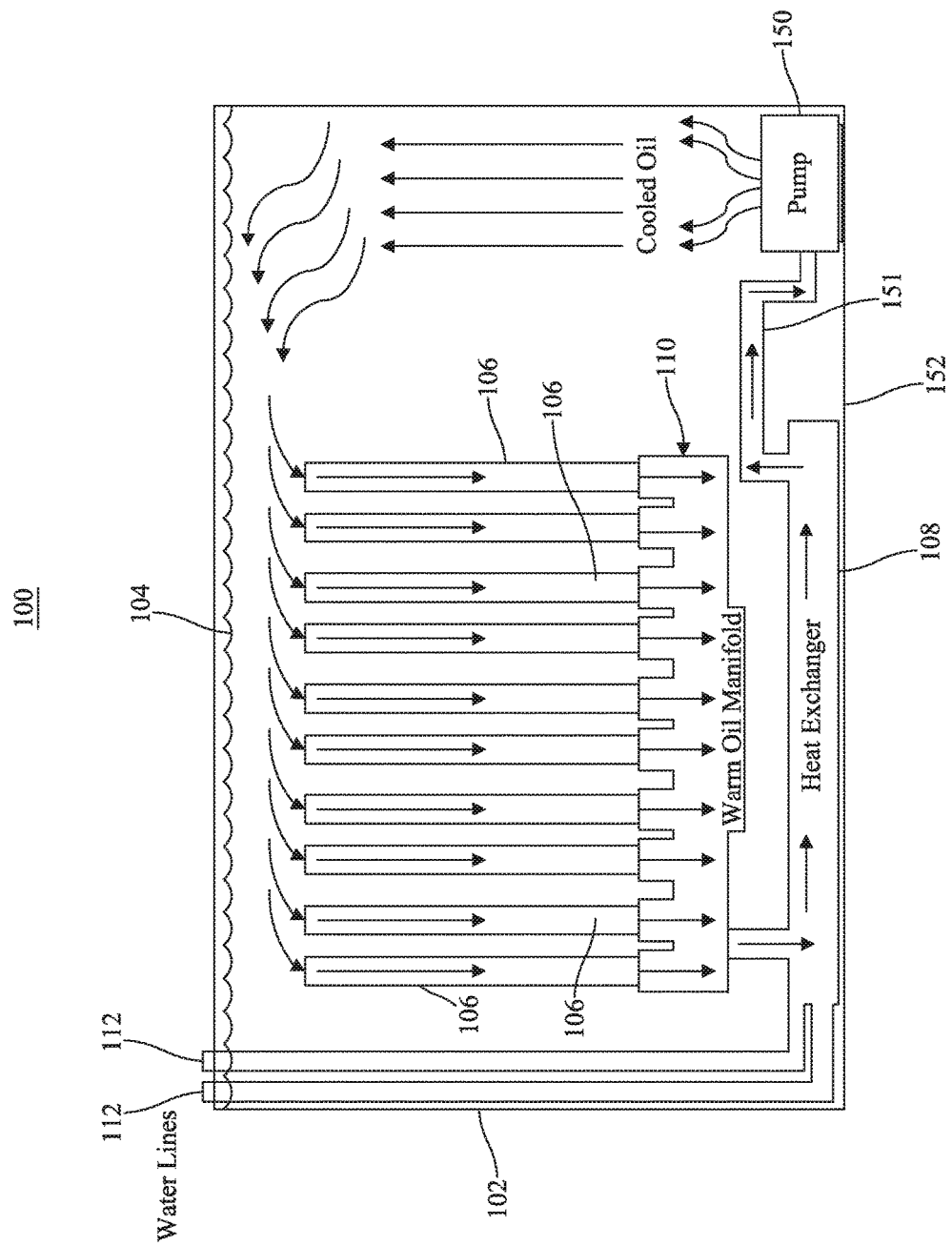
FIG. 1 is a schematic view of an embodiment of system for immersion cooling computing system equipment operated in a pull mode.

Referring initially to FIG. 1, exemplary embodiments are directed to a system for immersion cooling computing system equipment 100. The system includes a container 102. Suitable containers include, but are not limited to, low cost commodity containers or tanks that are used for shipping the cooling fluid, transporting the complete system for immersion cooling of computing system equipment and operating the computing or information technology (IT) system equipment on site. Suitable low cost commodity tanks include, but are not limited to, carboys, plastic water tanks, horizontal hauling tanks, fiberglass tanks, fuel tanks, pest control operator (PCO) liquid transport tanks and Intermediate Bulk Container (IBC) tanks including caged IBC tanks. Suitable materials for the containers include, but are not limited to, plastics, elastomers, metals, fiberglass and combinations thereof. In one embodiment, the containers are high density polyethylene (HDPE) tanks. These containers can be modified, preferably on site, to remove the top of the tanks to facilitate insertion of the components for the system for immersion cooling of computing system equipment.

In one embodiment, the container is an intermediate bulk container having a pallet base, a metal frame or metal cage, e.g., a galvanized or stainless steel cage, extending up from the pallet base and a plastic tank, i.e., a HDPE tank, supported by the pallet base and surrounded by the metal frame. Therefore, the plastic tank is enclosed and supported by the metal cage, and the metal cage is connected to and the plastic tank rests on an integrated galvanized or stainless steel pallet base. In general, IBC tanks are widely available and International Organization for Standardization (ISO) certified for shipping various types of fluids. These tanks are compatible with worldwide intermodal freight transport and are movable on site using forklifts. The use of IBC tanks minimizes the lead times needed to procure tanks and cooling fluids. In fact, such tanks are widely available in a variety of industries including the oil refining industry. In addition, ISO approved containers can be shipped quickly and inexpensively to any part of the world. The HDPE container is easily modified in the field. As IBC tanks are commodity items, the associated cost is low. In one embodiment, the IBC tank is a 330 gallon tote. Suitable IBC tanks have an overall height of about 48 inches (122 cm) to about 53 inches (135 cm). These tanks have a rectangular or square shape with exterior side dimensions of from about 40 inches (102 cm) up to about 48 inches (122 cm). The corners of the tank have a curvature with a typical radius of from about 2 inches (5 cm) to about 4 inches (10 cm). This yields interior side dimensions of up to about 40 inches (102 cm) in depth.

In one embodiment, the top of the HDPE tank is removed at a height of from about 44 inches to about 46 inches (112 cm to 117 cm) above the bottom of the tank. The placement of the cut depends on the radius of curvature of the corners of the tank, e.g., blow molded HDPE. The internal height of the tank corresponds to the height or depth of the immersion cooling fluid in the tank. Depending on the manufacturer of the tank, these internal dimensions may be as large as about 44 inches (112 cm) by about 36 inches (91 cm) in width and about 46 inches (117 cm) in height or depth. In one embodiment, the usable internal dimensions of the tank, given the radius of curvature of the corners, are at a minimum about 40 inches (102 cm) by about 32 inches (81 cm) in width and 44 inches (112 cm) in height or depth.

The system for immersion cooling of computing equipment also includes a volume of immersion cooling fluid 104 disposed in the container. The volume of a cooling fluid is suitable for immersion of the computing system equipment and compatible with the operation of the computing system equipment while immersed. Suitable cooling fluids include dielectric fluids such as dielectric oils including mineral oils and vegetable oils. Suitable dielectric immersion oils are known and available in the art. In one embodiment, the system includes multiple containers, and each container includes a volume of cooling. Each volume of cooling fluid is self-contained within a given container. In one embodiment, the immersion cooling fluid is shipped in the tanks to be used to contain the system for immersion cooling of computing system equipment. Therefore, the immersion cooling fluid is shipped to site in the tank, and the tank is modified on site to include the components of the system for immersion cooling of computing system equipment.

At least one heat generating computing system equipment component 106 is disposed in the volume of immersion cooling fluid. Alternatively, a plurality a computing system equipment components is disposed in the volume of immersion cooling fluid. Suitable heat generating computing system equipment components include conventional server chassis containing computing system and sever components. All the required wiring for power and communication to and from the heat generating computing system equipment components is in accordance with known and available equipment and methods for wiring within an immersion cooling computing environment.

The system for immersion cooling of computing system equipment includes a liquid-liquid heat exchanger 108 disposed in the volume of immersion cooling fluid. Suitable liquid-liquid heat exchangers include, but at not limited to, a shell and tube heat exchanger, a plate type heat exchanger and a tube and fin heat exchanger. In one embodiment, the system includes a plurality of liquid-liquid heat exchanger units containing a plurality of liquid-liquid heat exchangers. Circulation of the immersion cooling fluid occurs within the container, which is passed through a liquid-liquid heat exchanger that is also contained within the tank. Also, routed through the liquid-liquid heat exchanger is a secondary cooling fluid, e.g., water, that is used to cool the immersion cooling fluid and that is routed to each container or tank individually through water lines 112 extending into the container.

A manifold system 110 is disposed between the at least one heat generating computing system equipment component and the liquid-liquid heat exchanger. The manifold system directs a flow of immersion cooling fluid between the at least one heat generating computing system component and the liquid-liquid heat exchanger and isolates the flow of immersion cooling fluid from a bulk amount of immersion cooling fluid in the container. The flow of immersion cooling fluid and the bulk amount of immersion cooling fluid taken together constitute the volume of immersion cooling fluid in the container. Suitable materials for the manifold system include, but are not limited to, an elastomer, a plastic, a metal, acrylonitrile butadiene styrene (ABS) and combinations thereof. Preferably, the manifold system is constructed from acrylonitrile butadiene styrene. In one embodiment, the manifold system comprises a three dimensional (3D) printed manifold system. Therefore, the entire manifold system or the individual components of the manifold system are printed using a three-dimensional printer.

Figure 3:
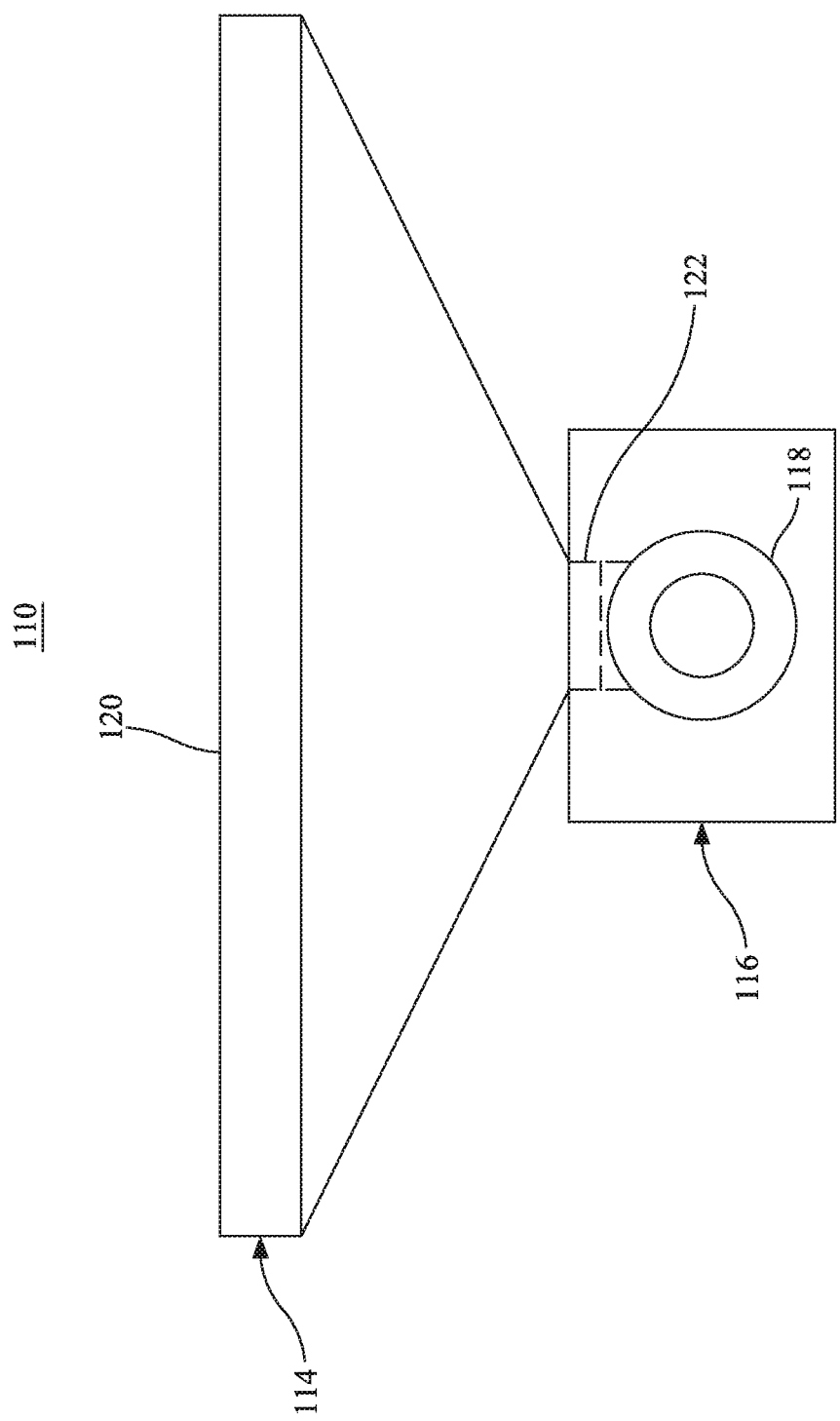
FIG. 3 is a schematic end-view representation of an embodiment of a manifold system.
Figure 4:
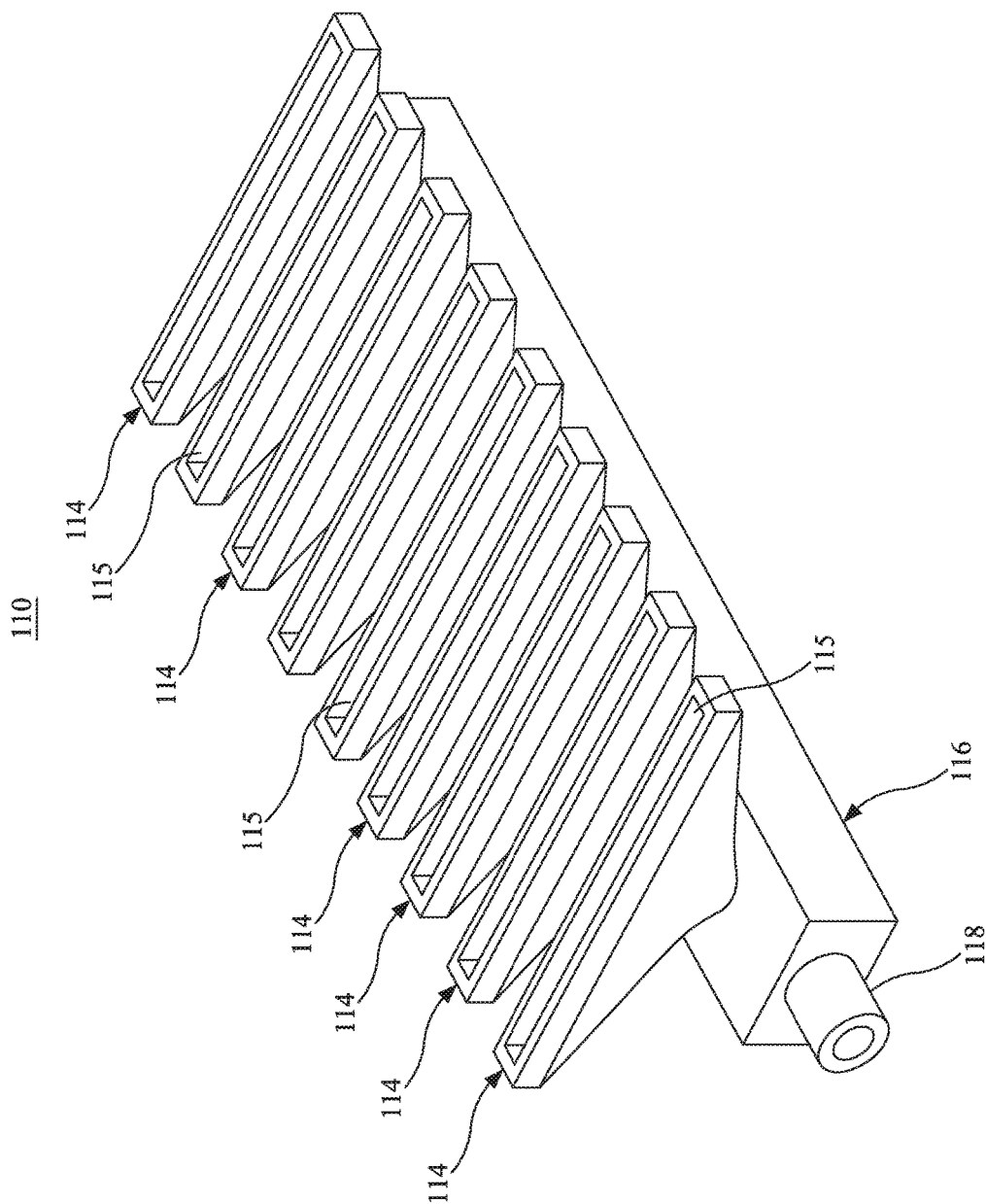
FIG. 4 is a schematic perspective representation from the top of an embodiment of a manifold system.
Figure 5:
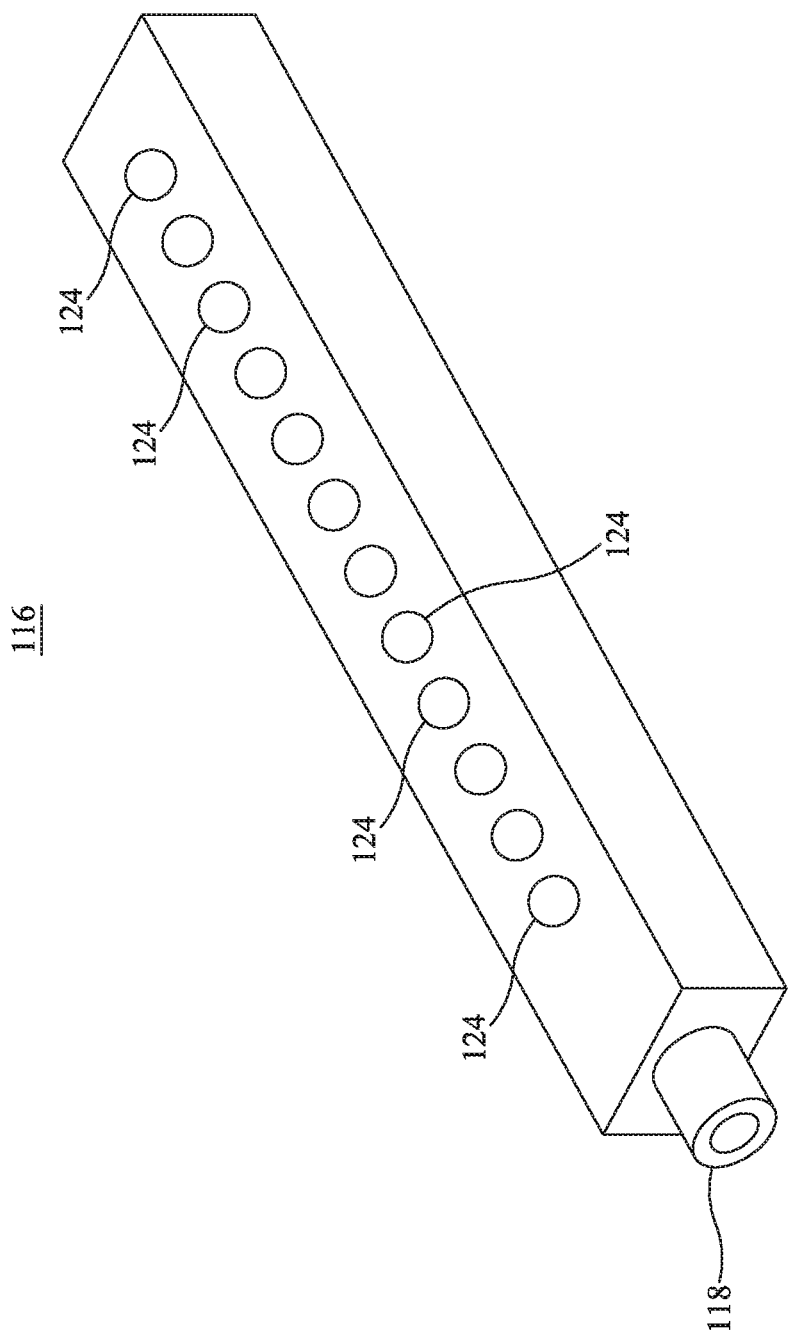
FIG. 5 is a schematic perspective representation from the top of an embodiment of a main manifold housing.

Referring to FIGS. 3-5, in one embodiment the manifold system 110 includes at least one and preferably a plurality of funnel-shaped computing system equipment component connector portions 114. Each one of the plurality of funnel-shaped computing system equipment component connector portions is separate and can be independently attached to and removed from a given computing system equipment component. Each funnel-shaped computing system equipment component connector portion is in contact with one of the computing system equipment components to collect all the immersion cooling fluid flowing through a given computing system equipment component or to direct the desired flow of immersion cooling fluid through a given computing system equipment component. Each funnel-shaped computing system equipment component connector portion includes a mouth 120 sized and shaped to connect to the computing system equipment component and a stem 122 in communication with the mouth through an interior channel 115.

In one embodiment, the funnel-shaped computing system equipment component connector portions are configured with a rectangular mouth to cover the front part of a standard IT system (18 inches or 46 cm wide and 1 U or more height) and extend up from the front part for about 1 inch (2.5 cm) to about 2 inches (5 cm). The 3D printed ABS plastic funnels are sized and shaped depending on the height of the computing system equipment components in rack units, and the weight of those components.

The manifold system also includes a main manifold housing 116 that is in communication with the stem of each funnel-shaped computing system equipment component connector portion. In one embodiment, the main manifold housing is placed on the bottom 152 of the container. The main manifold housing includes a common port 118 in communication with a plurality of stem ports 124. Each stem port is in communication with a given stem. The manifold system is modular, and funnel-shaped computing system equipment component connector portions can be added and removed as desired. Therefore, a given stem port may or may not be in communication with a stem. Plugs or integrated valves can be included to close a given stem port. In one embodiment, each stem port is identical in size and shape. Alternatively, the size and shape of each stem port is configured to provide a desired flow rate or pressure of immersion cooling fluid through the given stem and therefore, through a given computing system equipment component.

Figure 6:
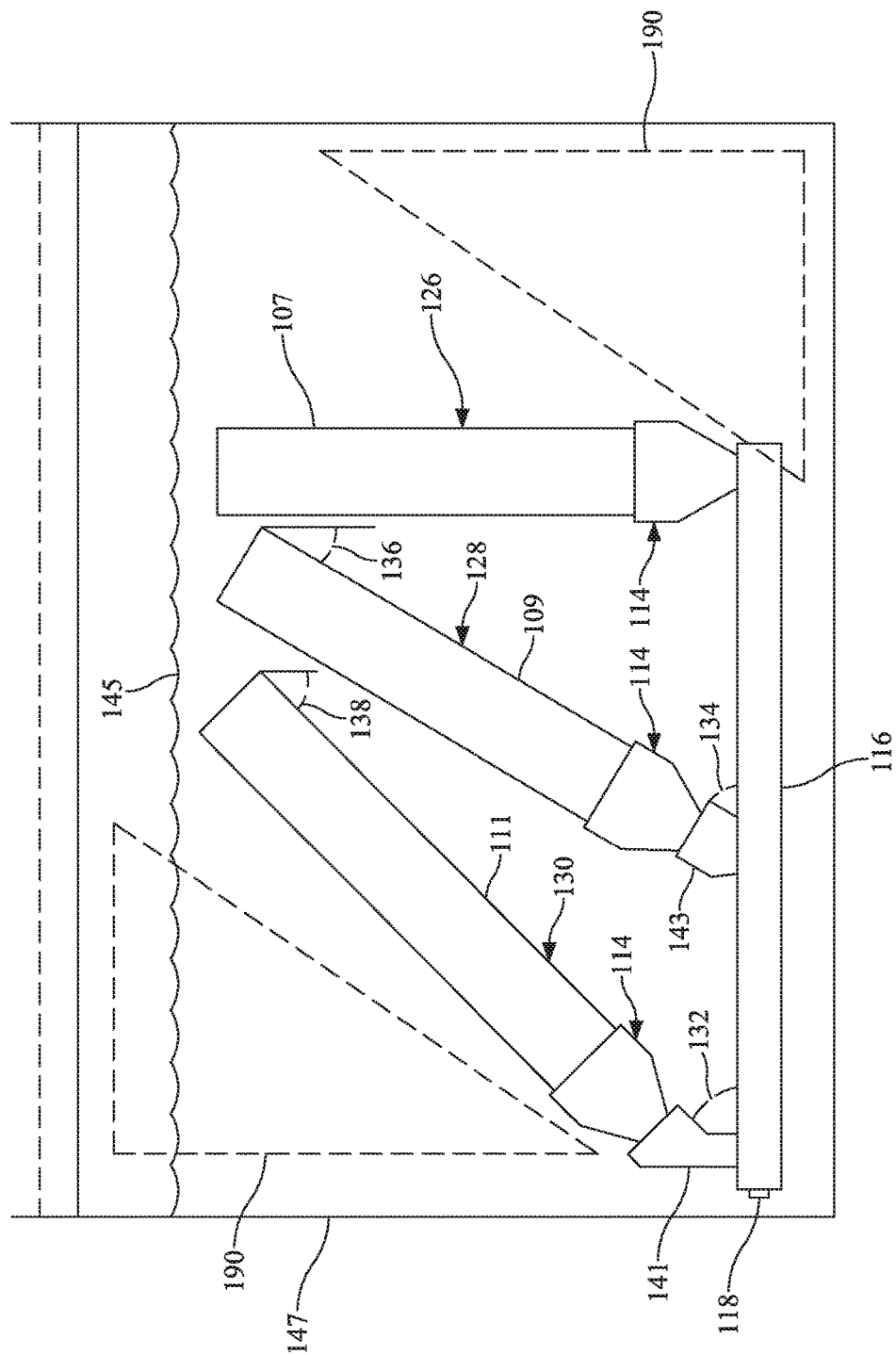
FIG. 6 is a schematic illustration of various angled orientations of the computing system equipment components within the container.

Referring now to FIG. 6, the stems of the funnel-shaped computing system equipment component connector portions can be connected directly in the stem ports, for example, when the computing system equipment components 107 are in a vertical orientation 126. This arrangement is suitable for server chassis having an overall length of depth of about 26 inches (66 cm). Longer server chassis such as 30 inches (76 cm) 109 and 37 inches (94 cm) 111, however, will not be completely immersed within the same given volume of immersion cooling fluid 145 in the container 147 in a vertical orientation due to their increased length.

Figure 7:
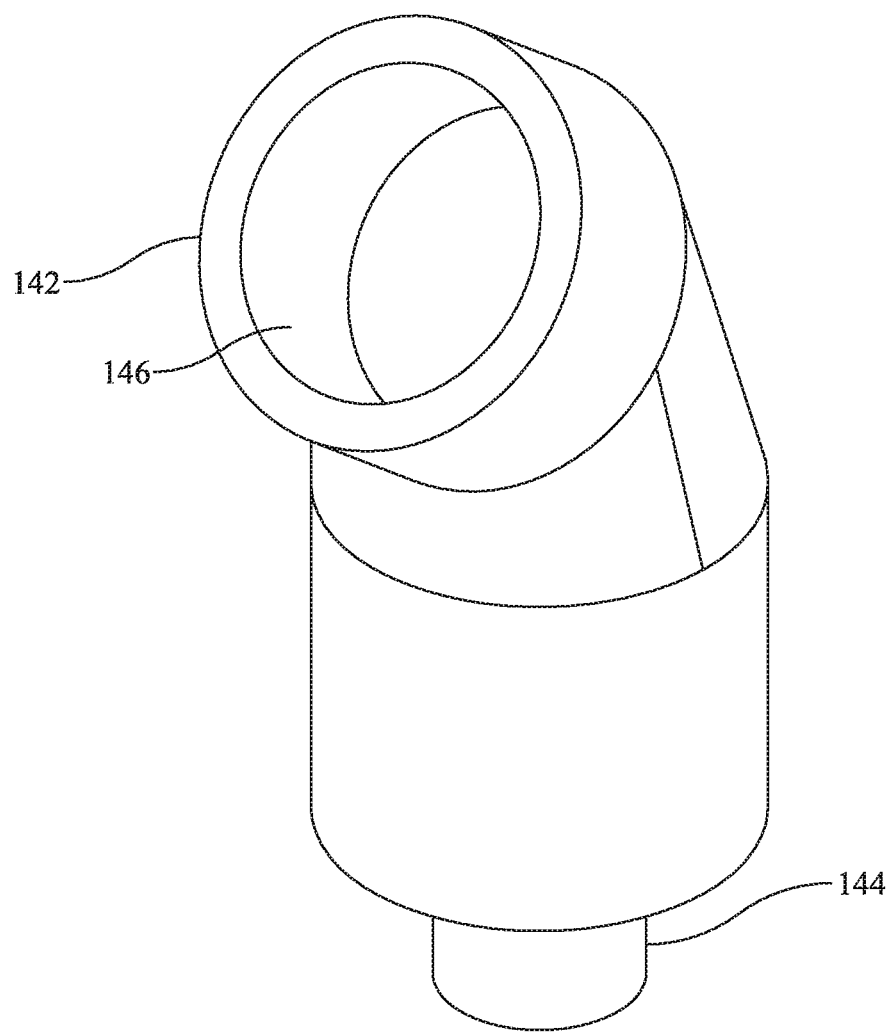
FIG. 7 is a perspective view of an embodiment of stem adaptor for the manifold system.

Therefore, referring to FIG. 7, the manifold system includes at least one, or a plurality of, stem adaptor 140 disposed between the stem and the main manifold housing. Each stem adaptor includes a stem end 142 for connecting to a given stem and a manifold stem port end 144 in communication with the stem end through an internal stem channel 146. The manifold stem port end is configured to connect to one of the stem ports. The stem adaptor and the stem channel is not straight but is angled. Each stem adaptor can have a fixed angle, such as a fixed unique angle or can have a variable angle, defined for example, by a rotating joint or ball joint. In one embodiment, these variable angle joints can be locked or set in a desired angle. In one embodiment, the stem is made from a flexible material that can be bent to the desired angle. The angle of the stem adaptor, and therefore, the associated angle from horizontal and angle from vertical of the computing system equipment component, is selected based upon the length of the computing system equipment component to be held by the manifold system.

Returning to FIG. 6, in a first angled embodiment 128, the stem adaptor 143 defines a first angle from horizontal 134 between the stem and the main manifold housing to hold that at least one computing system equipment component 109 at an angle from a vertical orientation 136 that is a complement of the angle from horizontal. This first angled embodiment is suitable for a computing system equipment component having a first length of about 30 inches (76 cm). In a second angled embodiment 130, the stem adaptor 141 defines a second angle from horizontal 132 between the stem and the main manifold housing to hold that at least one computing system equipment component 111 at an angle from a vertical orientation 138 that is a complement of the angle from horizontal. This second angled embodiment is suitable for a computing system equipment component having a second length of about 37 inches (94 cm). In these embodiments, the second length is greater than the first length. To accommodate this, the second angle from vertical 138 is greater than the first angle from vertical 136, and the first angle from horizontal 132 is less than the second angle from horizontal.

Returning to FIG. 1, the system for immersion cooling of computing system equipment also includes a submersible pump 150 disposed in the volume of immersion cooling fluid and in communication with the liquid-liquid heat exchanger 108. Suitable submersible pumps are known and available in the art. The submersible pump can be in direct contact with the liquid-liquid heat exchanger or can be in contact with the liquid-liquid heat exchanger through piping or tubing 151. The submersible pump is preferably located on the bottom 152 of the container.

In one embodiment, the main manifold housing common port, which can be a main exit port or inlet port depending on the mode of operation, is connected to the liquid-liquid heat exchanger. The size of the liquid-liquid heat exchanger depends on the number of the computing system equipment components and the heat load of each computing system equipment component. Chilled water, warm water, or sea water is routed through the cooling lines 112 to the liquid-liquid heat exchanger from an external source and functions as a cooling medium to remove heat from the immersion cooling fluid. The choice of the cooling medium depends on the location of the computing system, the climate, the water temperature, and the quality of the water. If there is no treatment available at the location for the cooling water, the heat exchanger may require periodic cleanings to remove debris and scale. When the liquid-liquid heat exchanger has a cylindrical external shape, e.g., a shell-tube heat exchanger, the liquid-liquid heat exchanger is placed on the bottom of the container next to the manifold system or under legs that support the manifold system and elevate the manifold system off the bottom of the container. A plate type liquid-liquid heat exchanger is placed on the bottom of the container with the manifold system placed on top of the liquid-liquid heat exchanger to manifold system and the computing system equipment components in the manifold system.

In one embodiment, a fixed speed submersible pump is used. A three-dimensional printed ABS gasket will be used to cover the suction part of the pump, so that it can effectively suck the hot oil directly from the heat exchanger and push it towards the surface by using its standard exit port. If the system designed to push cold oil instead pulling hot oil from the systems, the gasket won't be necessary.

Figure 2:
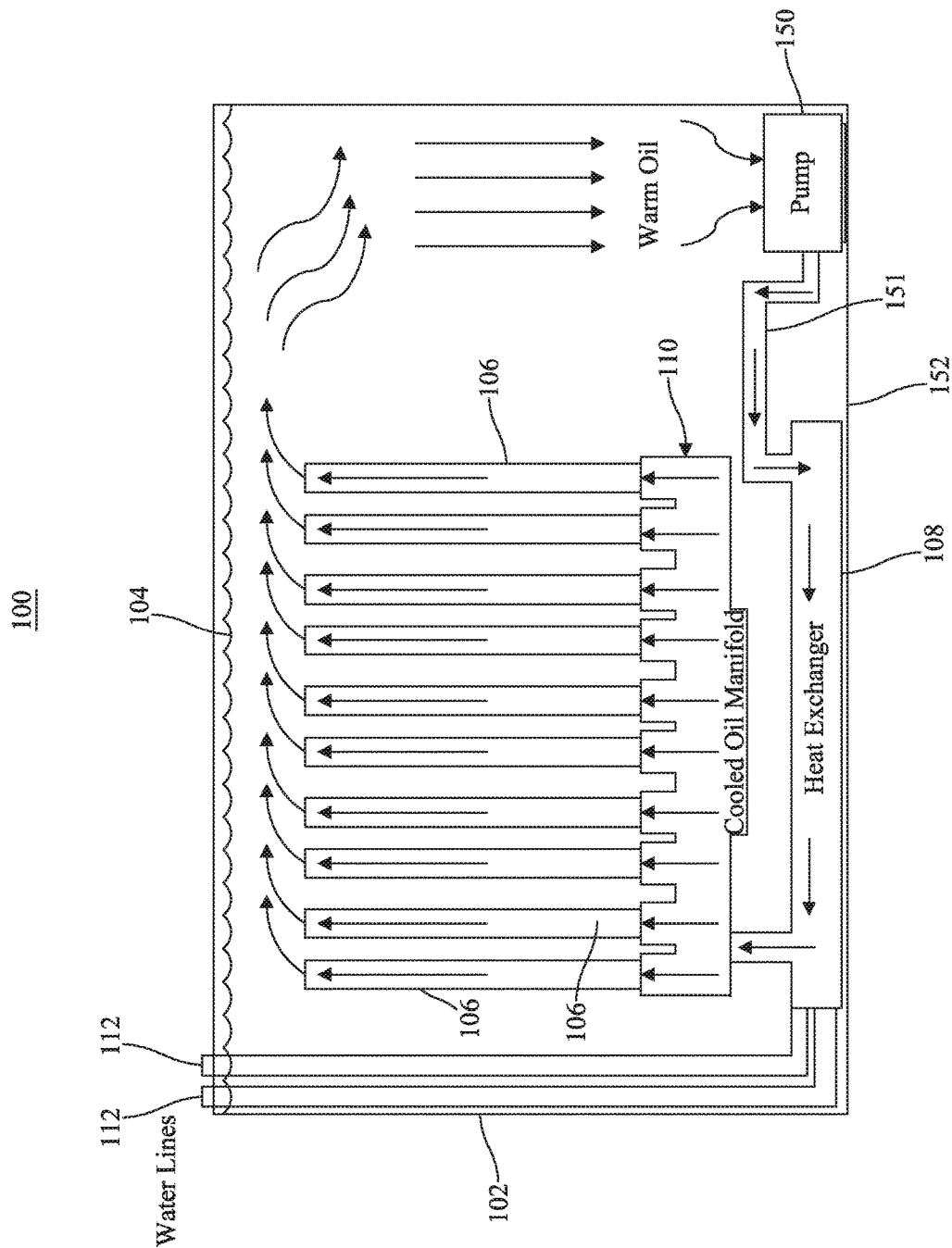
FIG. 2 is a schematic view of an embodiment of system for immersion cooling computing system equipment operated in a push mode.

The liquid-liquid heat exchanger is disposed between the manifold system and the submersible pump. Therefore, the pump can be operated in two modes, a pull mode and a push mode using an identical arrangement and configuration of components. As illustrated in FIG. 1, the submersible pump is configured to pull the flow of immersion cooling fluid, i.e., the heated immersion cooling fluid, through the computing system equipment components, the manifold system and the liquid-liquid heat exchanger, returning the cooled immersion cooling fluid to the top of the container. As illustrated in FIG. 2, the submersible pump is configured to push the flow of immersion cooling fluid, i.e., cooled immersion cooling fluid, through the liquid-liquid heat exchanger, the manifold system and the computing system equipment components, pulling the heated immersion cooling fluid from the top of the container. In both modes of operation, the use of the manifold system in combination with the liquid-liquid heat exchanger and submersible pump allows isolates the flow of immersion cooling fluid to be cooled from the bulk immersion cooling fluid for improved cooling.

In general, the manifold system supplies or sucks immersion cooling fluid from the computing system equipment or information technology (IT) systems, creating a containment environment to separate cold immersion cooling fluid from hot immersion cooling fluid. In addition, the manifold system can support to the computing system equipment components, eliminating the need for additional computing system equipment holders, for example, server racks, and rabbit ears, for computing system equipment components that are positioned vertically in the container and volume of immersion cooling fluid.

Alternatively, the system for immersion cooling of computing system equipment also includes at least one computing system equipment holder disposed within the container and in the volume of cooling liquid. In one embodiment, the system includes a plurality of computing system equipment holders. In one embodiment, the computing system equipment holder or rack is a server rack having a plurality of rack shelves or rack rails or shelf rails. The plurality of rack shelves is spaced from each other along the server rack, and each rack shelf has a height that varies from one rack unit to seven rack units. In one embodiment, the computing system equipment holders or racks have a width from side to side of from about 20 inches to about 20.5 inches (51 cm-52 cm). The computing system equipment holder or rack has a depth from rack front to rack back of about 28 inches (71 cm) to about 36 inches (91 cm). In addition, the computing system equipment holder or rack has a height from the rack bottom to the rack top of about 36.25 inches (92 cm), which provides total of 19 rack units (19 U, 33.25 inches or 84.5 cm) of space for IT equipment.

In one embodiment, standard computing system equipment or IT equipment four post 'open frame' racks or 'wall mount' racks are used. These racks are commercially available, low cost, lightweight computing equipment racks such as server racks having a plurality of shelves to hold server chassis or other computing equipment. Typically, these shelves are horizontal, running from the front to the back of the computing equipment racks. The racks are arranged with a rack bottom that can carry the weight of all the server chassis. When placed in the container with the immersion cooling fluid, however, the computer equipment racks are placed with the rack back adjacent the bottom of the container and the shelves in a vertical orientation. Therefore, the rack back of the computing equipment rack is carrying the weight, and structural improvements are made to each computing equipment rack to facilitate carrying weight by the rack back and also to accommodate forces applied to the computing equipment rack during shipping and field deployment of the system for immersion cooling of computing system equipment. Suitable structural improvements include, but are not limited to, additional welds or fasteners at the points of contact between the rack shelves and the computing system rack frame and addition structural members including single force and two force members and cross members Referring now to FIG. 8, arrangements of computing system equipment components 170 within containers 171 such as plastic containers and steel tanks utilize can orient the computing system equipment components vertically. These computing system components can be supported against gravity by the manifold system either independently or in combination with traditional rabbit ears. The tank depth 172 determines the maximum server size in this vertical alignment. Since immersion cooling fluid provides increased cooling efficiency over, for example, air cooling systems, 50 kW server racks or server chassis can be used. Server chassis with thermal densities above 25 kW per rack have much greater depths, in the range of 36 inches to 38 inches (91 cm to 96.5 cm).

To service a given computing system equipment component 174 in vertical arrangement, that given piece of equipment is removed vertically from the container to a height 173 at least equipment to the length of the computing system equipment component. This can be in access of the height of the operator 175 removing the computing system equipment component. In addition, a given computing system equipment component can have a weight in excess of 40-50 lbs. after accounting for the weight of enclosed oil.

Referring to FIG. 9, exemplary embodiments are directed to a system for immersion cooling computing system equipment having a container 202 and a volume of immersion cooling fluid 204 disposed in the container. At least one or a plurality of heat generating computing system equipment components 206 is disposed in the container and the volume of immersion cooling fluid. A liquid-liquid heat exchanger 208 is disposed in the volume of immersion cooling fluid. A manifold system 210 is disposed between the at least one heat generating computing system equipment component and the liquid-liquid heat exchanger to direct a flow of immersion cooling fluid between the heat generating computing system components. A submersible pump 250 is disposed in the volume of immersion cooling fluid in communication with the liquid-liquid heat exchanger 208 to push or to pull the immersion cooling fluid through the liquid-liquid heat exchanger, the manifold system and the computing system equipment components. External cooling lines 212 provide a secondary cooling fluid to the liquid-liquid heat exchanger.

The manifold system holds each computing system equipment component at an angle from a vertical orientation 236 within the container. All the computing system equipment components can be held at the same angle or the computing system equipment components can be held at a plurality of different angles from vertical. Holding of the of the computing system equipment components at the angle from a vertical orientation can be accomplished by using only the manifold system or by using the manifold system in combination with additional structural members or mounts attached to each computing system component.

Figure 10:
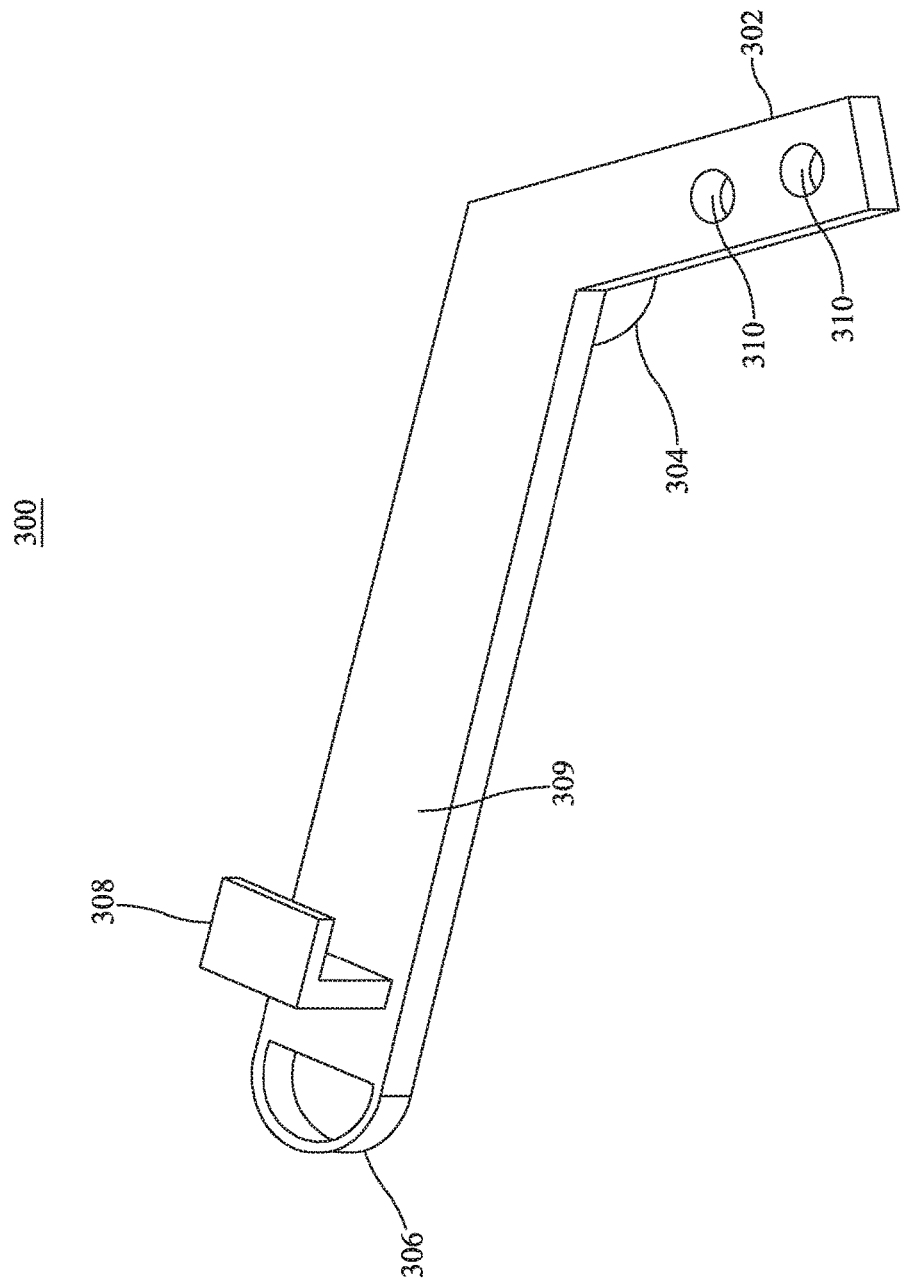
FIG. 10 is a perspective view of an embodiment of an angled adaptor for holding computing system equipment components.

Referring now to FIG. 10, in one embodiment, at least one angled mount 300 is provided for each computing system equipment component and is attached to each computing system equipment component. Each angled mount has a component attachment end 302 having one or more holes 310 for accepting bolts or fasteners for securing the computing system equipment component to the angled mount. The opposite end of the angled mount has a handle 306 that can be used to remove the computing system equipment component from the container. Between the attached end and the handle is a bend or angle 304 in the angled mount to support the at least one computing system equipment component at the angle from the vertical orientation. Suitable angles include about 30 degrees and about 45 degrees. The angle can be a set angle. Alternatively, the angled mount can be made of two sections that are pivotally attached together and moveable with respect to each other. Therefore, rotating the sections with respect to each other creates desired angle. The angled mount can then be locked in the desired angle using, for example, a set screw. A hook 308 extends from a flat side 309 of the angled mount between the angle and the handle. The hook is configured to engage the top edge of the container or a computing system equipment holder disposed in the volume of immersion cooling fluid. This provides support for the computing system equipment component and holds the computing system equipment holder at the desired angle from a vertical orientation. In one embodiment, each angled mount is a stamped sheet metal angled mount. Alternatively, the angled mount is a 3D printed angled mount that is printed from rigid ABS plastic.

Returning to FIG. 9, in one embodiment, the computing system equipment components are held at the angle from a vertical orientation using the manifold system. As described above, the manifold system includes the funnel-shaped computing system equipment component connector portion having the mouth connected to the computing system equipment component and the stem in communication with the mouth. The main manifold housing is in communication with the stem, and a stem adaptor is provided between the stem and the main manifold housing. The stem adaptor defines an angle from horizontal 234 between the stem and the main manifold housing to hold each computing system equipment component at the angle from a vertical orientation 236 that is a complement of the angle from horizontal.

As illustrated in FIG. 9, the computing system equipment component is either a 'full depth' 30 inch (76 cm) deep server chassis angled at a 30 degree angle from vertical or an 'extended depth' 37 inch (94 cm) deep server chassis at a 45 degree angle from vertical. Both of these server chassis fit into and are immersed in the same volume of immersion cooling fluid 204. However, removal of a given computing system equipment component 274 in an angled arrangement allows that given piece of equipment to be removed through a height 273 that is less than the length of the computing system equipment component and therefore less than the height required in a vertical arrangement. This lower height is more compatible with access of the height of the operator 275 removing the computing system equipment component.

Exemplary embodiments utilize conventional, commodity components that are easily and inexpensively sourced as stamped sheet metal from local machine shops or 3D printed from ABS plastic. Angling of the computing system equipment components or server chassis, however, can result in unused or dead space 190 (FIG. 6) within the container. With a 45 degree angle from vertical a standard 6 foot (183 cm) server rack, an 8 foot (244 cm) tank is needed to fully utilize the rack. This represents a 33% overhead in floor space. The illustrated unused spaced can be used to hold the submersible pump and liquid-liquid heat exchanger as well as other components of the system to recover this area as usable space.

In one embodiment, the direction of immersion cooling fluid flow is across the face of computing system equipment components towards the tank edges. The immersion cooling fluid flows downwards in a return path to heat exchangers. Assuming 1 to 2 gallons/minute of fluid flow are needed to cool a single server, the realized fluid velocity is calculated by comparing this to the server height (1 U or 1.75 inches or 4.4 cm) times the fluid depth, typically 1.25 inches (3.2 cm). High fluid velocities introduce turbulence, which in turn creates air bubbles. Air bubbles are undesirable with respect to cooling, pump cavitation and oxidation of immersion cooling fluid. Turbulence can be seen as ripples in the surface of the oil, indicating the presence of air bubbles.

Modifications to the direction of flow of the immersion cooling fluid, reductions in fluid flow velocity and changes to the arrangement of the computing system equipment components are used reduce air bubbles and turbulence. In addition, server rabbit ears which increase flow resistance and generate air bubbles can be eliminated. Better compatibility with wider racks and 1U blades, for example as with Open Compute is also provided.

Figure 11:
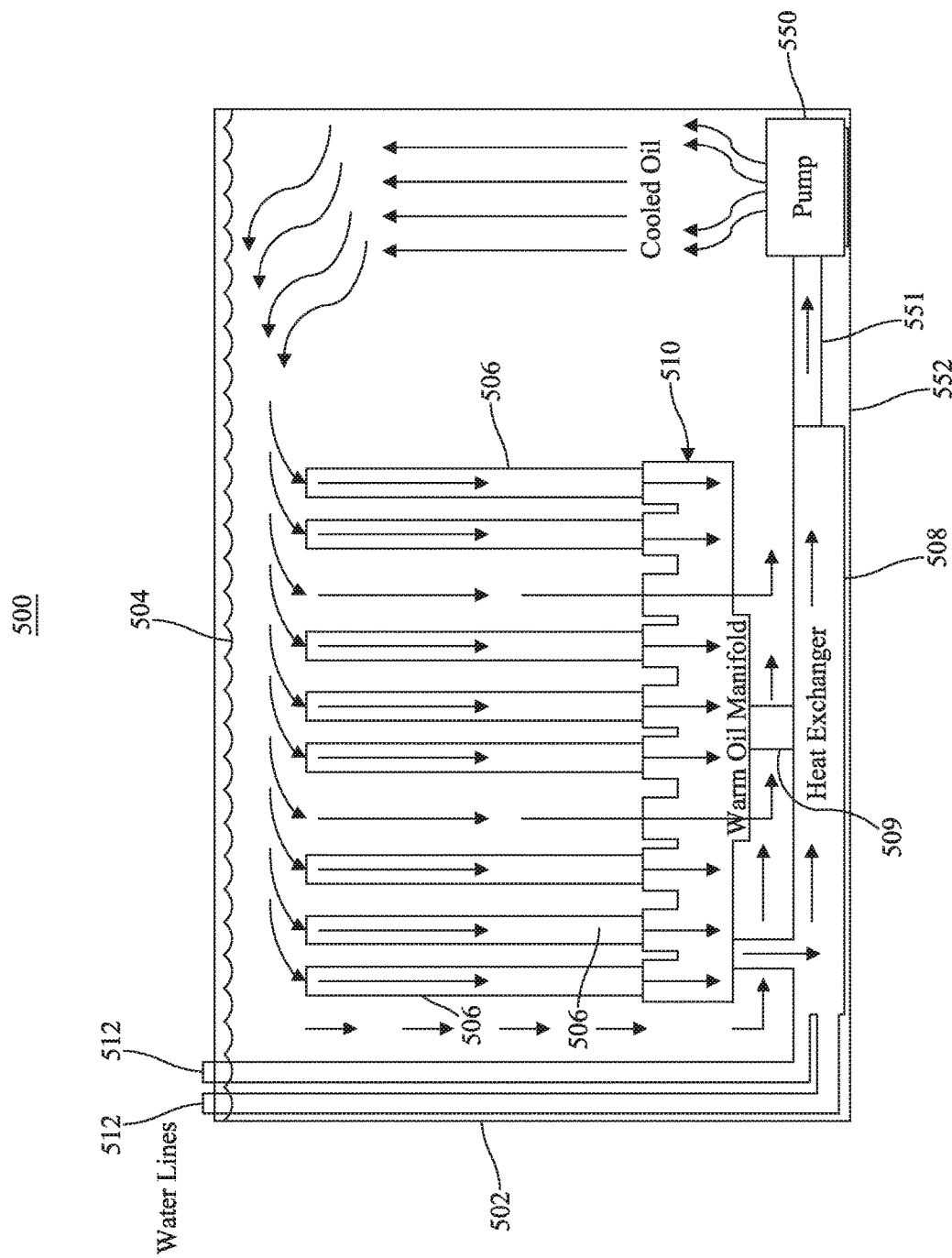
FIG. 11 is a schematic view of an embodiment of system for immersion cooling computing system equipment with computing equipment removed for improved bulk cooling fluid flow.

Referring to FIG. 11, an embodiment of a system for immersion cooling computing system equipment 500 is illustrated. The system includes a container 502 and a volume of immersion cooling fluid 504 disposed in the container. A liquid-liquid heat exchanger 508 is disposed in the volume of immersion cooling fluid. Also routed through the liquid-liquid heat exchanger is a secondary cooling fluid, e.g., water, that is used to cool the immersion cooling fluid and that is routed to each container or tank individually through water lines 512 extending into the container. A manifold system 510 is disposed between the at least one heat generating computing system equipment component and the liquid-liquid heat exchanger. The manifold system directs a flow of immersion cooling fluid between the at least one heat generating computing system component and the liquid-liquid heat exchanger and isolates the flow of immersion cooling fluid from a bulk amount of immersion cooling fluid in the container. The flow of immersion cooling fluid and the bulk amount of immersion cooling fluid taken together constitute the volume of immersion cooling fluid in the container. Eight of those components.

In one embodiment, the main manifold housing is placed on the bottom 552 of the container. A submersible pump 550 disposed in the volume of immersion cooling fluid and in communication with the liquid-liquid heat exchanger 508. Suitable submersible pumps are known and available in the art. The submersible pump can be in direct contact with the liquid-liquid heat exchanger or can be in contact with the liquid-liquid heat exchanger through piping or tubing 551. The submersible pump is preferably located on the bottom 552 of the container.

In this embodiment, every $N^{th}$ computing system equipment component or server chassis is removed from the manifold system. This provides a pathway for bulk amount of immersion cooling fluid to flow upwards, vertically through and around the computing system equipment components with enhanced flow due to natural convection, and downwards where the computing system equipment components are removed. Alternatively, the flow loop is reversed, depending on the liquid-liquid heat exchanger and submersible pump arrangement. If every $10^{th}$ computing system equipment component is removed, there is no net loss of computing system equipment space, and immersion cooling fluid velocities are comparable to original flow paths. Flow restrictions are minimal. In one embodiment, cells of 9×1 U computing system equipment components in combination with a 1×1 U opening can be interlaced. This provides a 2 U open area for return flow, which allows more flexibility in the use of available submersible pumps and liquid-liquid heat exchangers. For example, a cell becomes 9×1 U computing system equipment components plus a 1×2 U open area plus 9×1 U computing system equipment components. With the solid line flow arrangement one simply adjusts the value of N as needed to accommodate increased thermal density. In one embodiment, the system for immersion cooling computing system equipment 500 includes at least one additional pump 509 to move the bulk amount of immersion cooling fluid through and around the computing system components. Suitable additional pumps include, but are not limited to, fans (12 k-16 k rpm) or small direct current (DC) bilge pumps.

Exemplary embodiments increase the overall efficiency, serviceability, and maintainability of the immersion tank cooling. In particular, procurement times are reduced from months to weeks or less, and cost is reduced by a factor of ten. The resulting computing systems are modular and mobile, having increased flexibility and modification capability that can be customized based on the specifications of the seismic projects and the IT equipment. In addition, the system for immersion cooling of computing system equipment provides increased safety against spills by routing the immersion cooling fluid within the container and routing the secondary cooling fluid directly into the containing, eliminating external modules.

Figure 12:
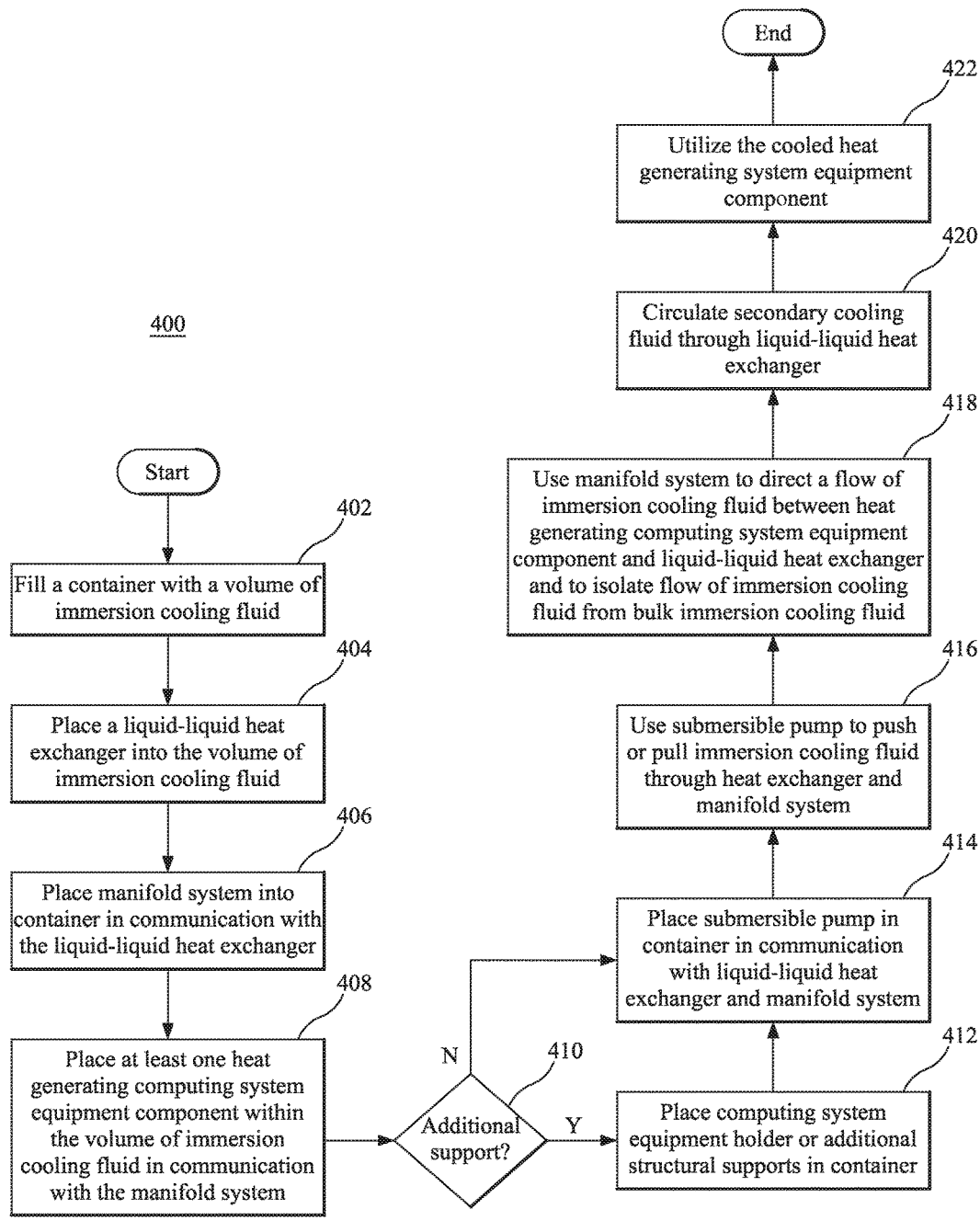
FIG. 12 is a flow chart illustrating an embodiment of a method for immersion cooling computing system equipment.

Referring now to FIG. 12, exemplary embodiments are directed to a method for immersion cooling computing system equipment 400. A suitable container is filled with a volume of immersion cooling fluid 402. Alternatively, the container can be filled with the volume of immersion cooling fluid after all the equipment is placed inside the container. Therefore, if equipment needs to be pulled out or modified during installation, that equipment is not covered with the immersion cooling fluid. This also facilitates leak testing of the container prior to installation of the equipment and filling with immersion cooling fluid. In one embodiment, only a portion of the volume of immersion cooling fluid is placed into the container, followed by the equipment. The remainder of the volume of immersion cooling fluid is then placed in the container. This avoids overflowing or spilling the immersion cooling fluid.

Suitable immersion cooling fluids are discussed herein and include dielectric oils. A liquid-liquid heat exchanger is placed into the container and in the volume of immersion cooling fluid 404. In one embodiment, the liquid-liquid heat exchanger is placed on the bottom of the interior of the container. A manifold system is also placed into the container and in the volume of immersion cooling fluid in communication with the liquid-liquid heat exchanger 406. Suitable combinations of liquid-liquid heat exchangers and manifold systems are discussed herein. In one embodiment, the manifold system is placed on the bottom of the interior of the container in fluid communication with the liquid-liquid heat exchanger. Alternatively, the manifold system is placed into the interior of the container on top of the liquid-liquid heat exchanger. The manifold system can be configured to hold computing system equipment components in a vertical arrangement or at an angle from vertical as described herein. In one embodiment, a determination is made regarding the size of heat generating computing system equipment components to be held in the manifold system. Based on this determination, the manifold system including the angular orientations of the computing system equipment components is constructed. In one embodiment, construction of the manifold system considers the size of the container and the depth of the volume of immersion cooling fluid within the container. In one embodiment, the manifold system is printed in ABS plastic using a 3D printer. In one embodiment, the manifold system is assembled from a plurality of components including a funnel-shaped computing system equipment component connector portion, a stem adaptor and a main manifold housing each of which can be printed in ABS plastic using a 3D printer.

At least one heat generating computing system equipment component is placed in the volume of immersion cooling fluid in communication with the manifold system 408. In one embodiment, a plurality of heat generating computing system equipment components are placed in the volume of immersion cooling fluid in communication with the manifold system. The heat generating computing system equipment components are connected to the manifold system such that the manifold system is disposed between each heat generating computing system equipment component and the liquid-liquid heat exchanger.

A determination is made regarding whether additional structural supports are needed within the container to support the heat generating computing system equipment components 410. If additional structural support is needed, then additional structural supports including computing system equipment holder or one or more angled mounts are placed in the container 412. The heat generating computing system equipment components are connected to this additional structural supports.

A submersible pump is placed in the container within the volume of immersion cooling fluid in communication with the liquid-liquid heat exchanger, the manifold system and the heat generating computing system equipment components 414. In one embodiment, the submersible pump is placed on the bottom of the container. The submersible pump is used to push or pull the immersion cooling fluid through the liquid-liquid heat exchanger, the manifold system and the heat generating computing system equipment components 416.

The manifold system to direct a flow of immersion cooling fluid between the heat generating computing system equipment components and the liquid-liquid heat exchanger and to isolate the flow of immersion cooling fluid from a bulk amount of immersion cooling fluid 418. The flow of immersion cooling fluid and the bulk amount of immersion cooling fluid constitute the volume of immersion cooling fluid. A secondary cooling fluid is circulated or directed through the liquid-liquid heat exchanger 420, for example, from a source external to the container, to remove heat from the flow of immersion cooling fluid. The cooled heat generating computing system equipment components are utilized 422 for a desired application such as a seismic survey.

Although the features and elements of the present exemplary embodiments are described in the embodiments in particular combinations, each feature or element can be used alone without the other features and elements of the embodiments or in various combinations with or without other features and elements disclosed herein. The methods or flowcharts provided in the present application may be implemented in a computer program, software, or firmware tangibly embodied in a computer-readable storage medium for execution by a geophysics dedicated computer or a processor.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A system for immersion cooling computing system equipment, the system comprising:
a container;
a volume of immersion cooling fluid disposed in the container;
at least one heat generating computing system equipment component disposed in the volume of immersion cooling fluid;
a liquid-liquid heat exchanger disposed in the volume of immersion cooling fluid; and
a manifold system disposed between the at least one heat generating computing system equipment component and the liquid-liquid heat exchanger to direct a flow of immersion cooling fluid between the at least one heat generating computing system component and the liquid-liquid heat exchanger and to isolate the flow of immersion cooling fluid from a bulk amount of immersion cooling fluid, the flow of immersion cooling fluid and the bulk amount of immersion cooling fluid comprising the volume of immersion cooling fluid,
wherein manifold system includes
a funnel-shaped computing system equipment component connector portion comprising: a mouth connected to the computing system equipment component, and a stem in communication with the mouth, and
a main manifold housing in communication with the stem.

2. The system of claim 1, wherein the container comprises a plastic tank.

3. The system of claim 2, wherein the plastic tank comprises high density polyethylene.

4. The system of claim 1, wherein the immersion cooling fluid comprises dielectric oil.

5. The system of claim 1, wherein the at least one heat generating computing system equipment component comprises a server chassis.

6. The system of claim 5, further comprising a computing system equipment holder disposed in the volume of immersion cooling fluid, the server chassis attached to the computing system equipment holder.

7. The system of claim 1, further comprising a submersible pump disposed in the volume of immersion cooling fluid and in communication with the liquid-liquid heat exchanger.

8. The system of claim 7, wherein the submersible pump is configured to push the flow of immersion cooling fluid through the liquid-liquid heat exchanger, the manifold system and the at least one computing system equipment component.

9. The system of claim 7, wherein the submersible pump is configured to pull the flow of immersion cooling fluid through the at least one computing system equipment component, the manifold system and the liquid-liquid heat exchanger.

10. The system of claim 1, wherein the manifold system comprises an elastomer, a plastic, a metal, acrylonitrile butadiene styrene or combinations thereof.

11. The system of claim 1, wherein:
the system comprises a plurality of computing system equipment components; and
the manifold system comprises a plurality of separate funnel-shaped computing system equipment component connector portions, the mouth of each funnel-shaped computing system equipment component connector portion in communication with one of the plurality of computing system equipment components and the stem of each funnel-shaped computing system equipment component connector portion in communication with the main manifold housing.

12. The system of claim 11, wherein the main manifold housing comprises a plurality of stem ports, each stem port in communication with a given stem and comprising a size configured to provide a desired flow rate of immersion cooling fluid through the given stem.

13. The system of claim 1, wherein the manifold system further comprises a stem adaptor disposed between the stem and the main manifold housing, the stem adaptor defining an angle from horizontal between the stem and the main manifold housing to hold that at least one computing system equipment component at an angle from a vertical orientation that is a complement of the angle from horizontal.

14. A system for immersion cooling computing system equipment, the system comprising:
   a container;
   a volume of immersion cooling fluid disposed in the container;
   at least one heat generating computing system equipment component disposed in the container and the volume of immersion cooling fluid;
   a liquid-liquid heat exchanger disposed in the volume of immersion cooling fluid; and
   a manifold system disposed between the at least one heat generating computing system equipment component and the liquid-liquid heat exchanger to direct a flow of immersion cooling fluid between the at least one heat generating computing system component and the liquid-liquid heat exchanger and to hold each computing system equipment component at an angle from a vertical orientation within the container,
   wherein manifold system includes
   a funnel-shaped computing system equipment component connector portion comprising: a mouth connected to the computing system equipment component, and a stem in communication with the mouth, and
   a main manifold housing in communication with the stem.

15. The system of claim 14, further comprising:
   a computing system equipment holder disposed in the volume of immersion cooling fluid; and
   at least one angled mount attached to the at least one computing system equipment component and the computing system equipment holder to support the at least one computing system equipment component at the angle from the vertical orientation.

16. The system for immersion cooling computing system equipment of claim 14, wherein the angle is about 30 degrees or about 45 degrees.

17. A method for immersion cooling computing system equipment, the method comprising:
   filing a container with a volume of immersion cooling fluid;
   placing a liquid-liquid heat exchanger in the volume of immersion cooling fluid;
   placing a manifold system in the volume of immersion cooling fluid in communication with the liquid-liquid heat exchanger;
   placing at least one heat generating computing system equipment component in the volume of immersion cooling fluid in communication with the manifold system such that the manifold system is disposed between the at least one heat generating computing system equipment component and the liquid-liquid heat exchanger; and
   using the manifold system to direct a flow of immersion cooling fluid between the at least one heat generating computing system component and the liquid-liquid heat exchanger and to isolate the flow of immersion cooling fluid from a bulk amount of immersion cooling fluid, the flow of immersion cooling fluid and the bulk amount of immersion cooling fluid comprising the volume of immersion cooling fluid,
   wherein the manifold system is configured to hold at least one computer equipment at an angle about 30 degrees or about 45 degrees.

* * * * *